US012672554B2

(12) United States Patent
Yu et al.

(10) Patent No.: US 12,672,554 B2
(45) Date of Patent: Jun. 30, 2026

(54) PACKAGE STRUCTURE AND METHOD OF MANUFACTURING THE SAME

(71) Applicant: Jentech Precision Industrial Co., LTD., Taoyuan City (TW)

(72) Inventors: Chin-Jui Yu, Taoyuan City (TW); Jheng-Dong Huang, Taoyuan City (TW); Yin-Hsien Yang, Taoyuan City (TW); Jian-Tsai Chang, Taoyuan City (TW)

(73) Assignee: Jentech Precision Industrial Co., LTD., Taoyuan City (TW)

( * ) Notice: Subject to any disclaimer, the term of this patent is extended or adjusted under 35 U.S.C. 154(b) by 371 days.

(21) Appl. No.: 18/487,137

(22) Filed: Oct. 16, 2023

(65) Prior Publication Data

US 2024/0355639 A1 Oct. 24, 2024

(30) Foreign Application Priority Data

Apr. 24, 2023 (TW) ................................. 112115178

(51) Int. Cl.
| | |
|---|---|
| *H01L 21/48* | (2006.01) |
| *H10H 20/852* | (2025.01) |
| *H10H 20/857* | (2025.01) |
| *H10W 70/04* | (2026.01) |
| *H10W 70/05* | (2026.01) |

(52) U.S. Cl.
CPC ........ *H10W 70/048* (2026.01); *H10H 20/852* (2025.01); *H10H 20/857* (2025.01); *H10W 70/042* (2026.01); *H10W 70/095* (2026.01)

(58) Field of Classification Search
CPC ............. H10W 70/048; H10W 70/042; H10H 20/852; H10H 20/857
See application file for complete search history.

(56) References Cited

U.S. PATENT DOCUMENTS

| | | | |
|---|---|---|---|
| 6,377,002 B1 * | 4/2002 | Ge | ........................... H01J 9/148 |
| | | | 315/366 |
| 7,859,586 B2 * | 12/2010 | Murata | .................... H10F 77/50 |
| | | | 348/340 |

(Continued)

FOREIGN PATENT DOCUMENTS

| | | |
|---|---|---|
| JP | H04148556 A | 5/1992 |
| JP | H06334086 A | 12/1994 |

(Continued)

*Primary Examiner* — Thao P Le
(74) *Attorney, Agent, or Firm* — CKC & Partners Co., LLC

(57) ABSTRACT

A package structure and a method of manufacturing the same are provided. The method of manufacturing the package structure includes several steps as follows. A lead frame is provided. A first mask layer is formed on an upper surface of the lead frame and a second mask layer is formed on a lower surface of the lead frame, so that the first mask layer, the lead frame and the second mask layer are formed together to be a multilayered structure. A patterning process is performed on the multilayered structure, so a through hole penetrating through the multilayered structure is formed. A sandblasting process is performed in the through hole to form a rough textured surface in the through hole. After that, the first mask layer and the second mask layer are removed to expose the upper surface and the lower surface of the lead frame.

17 Claims, 8 Drawing Sheets

(56)                References Cited

U.S. PATENT DOCUMENTS

| | | | | |
|---|---|---|---|---|
| 9,917,024 | B2 * | 3/2018 | Standing | H10W 70/095 |
| 2002/0163408 | A1 * | 11/2002 | Fujii | H01H 59/0009 |
| | | | | 335/2 |
| 2002/0187318 | A1 | 12/2002 | Yamashita et al. | |
| 2003/0006503 | A1 * | 1/2003 | Yoneda | H10W 70/042 |
| | | | | 257/730 |
| 2008/0277776 | A1 | 11/2008 | Enomoto | |
| 2016/0057833 | A1 * | 2/2016 | Oh | H05B 33/22 |
| | | | | 313/503 |
| 2017/0040498 | A1 * | 2/2017 | Tamaki | H10H 20/8506 |
| 2018/0177019 | A1 * | 6/2018 | Oh | H10H 20/856 |
| 2018/0287005 | A1 * | 10/2018 | Camargo | H10F 55/00 |
| 2019/0008049 | A1 * | 1/2019 | Liu | H05K 3/002 |
| 2019/0304910 | A1 * | 10/2019 | Fillion | H03K 19/017545 |
| 2019/0355651 | A1 * | 11/2019 | Milo | H10W 70/042 |
| 2019/0385938 | A1 * | 12/2019 | Shi | H10W 70/042 |
| 2019/0393392 | A1 * | 12/2019 | Choi | H10H 20/857 |
| 2020/0135604 | A1 * | 4/2020 | Yen | H10W 74/014 |
| 2020/0176648 | A1 * | 6/2020 | Chen | H10H 20/854 |
| 2020/0212271 | A1 * | 7/2020 | Reingruber | H10H 20/852 |
| 2020/0273720 | A1 * | 8/2020 | Stiborek | H10W 70/048 |
| 2020/0303286 | A1 * | 9/2020 | Hishiki | H10W 70/457 |
| 2020/0312753 | A1 * | 10/2020 | Hishiki | H10W 70/457 |
| 2022/0165611 | A1 * | 5/2022 | Yu | H10W 20/083 |

FOREIGN PATENT DOCUMENTS

| | | | |
|---|---|---|---|
| JP | H10-6221 | A | 1/1998 |
| JP | H10135390 | A | 5/1998 |
| JP | H1197612 | A | 4/1999 |
| JP | H11168165 | A | 6/1999 |
| JP | 2002050730 | A | 2/2002 |
| JP | 2002270744 | A | 9/2002 |
| JP | 2006140265 | A | 6/2006 |
| JP | 2006303216 | A | 11/2006 |
| JP | 2012045651 | A | 3/2012 |
| JP | 2016105432 | A | 6/2016 |
| JP | 2019006085 | A | 1/2019 |
| TW | I348212 | B | 9/2011 |
| TW | I428182 | B | 3/2014 |
| TW | I600131 | B | 9/2017 |
| WO | 2007061112 | A1 | 5/2007 |
| WO | 2015/056555 | A1 | 4/2015 |

* cited by examiner

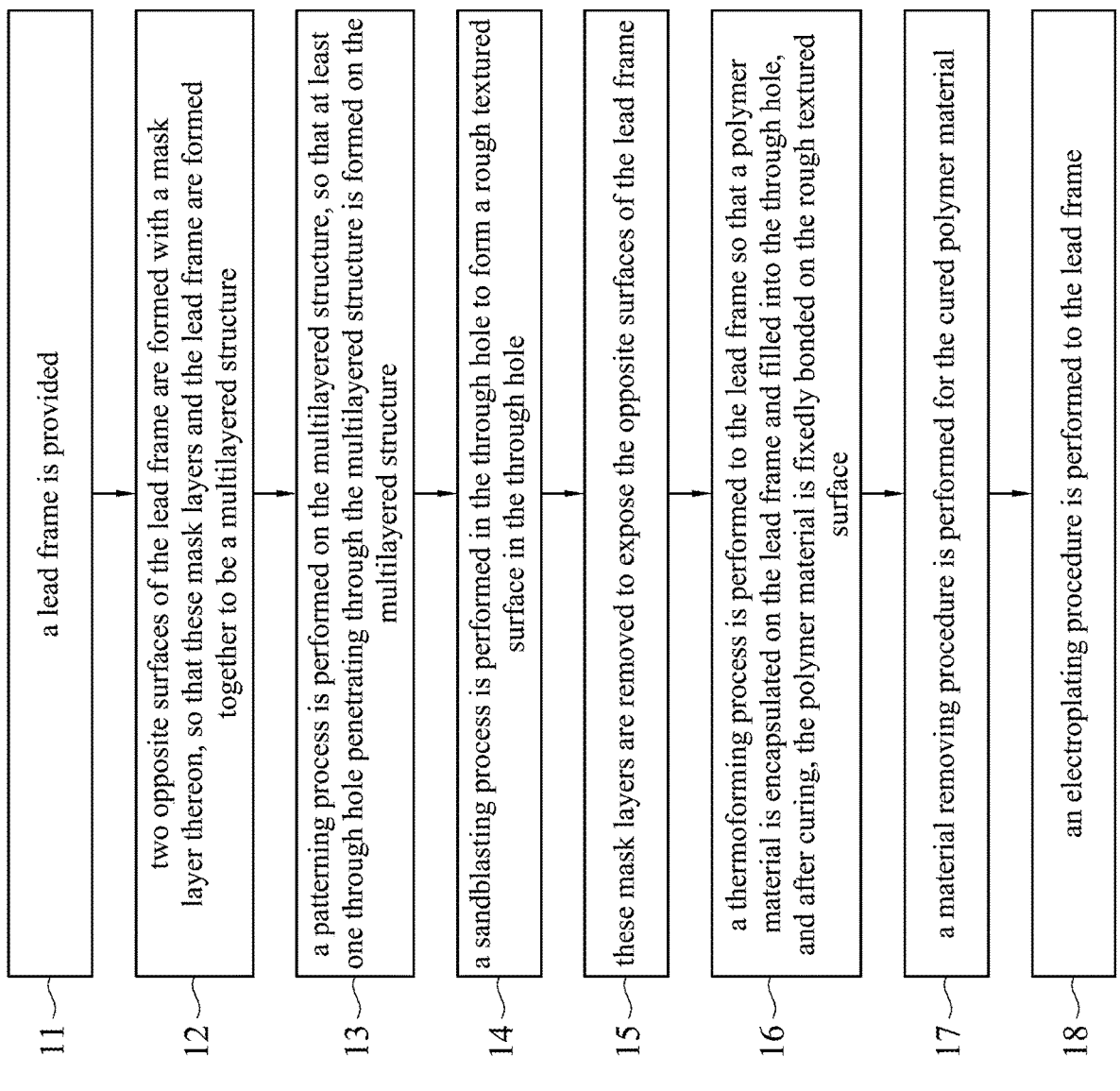

11 — a lead frame is provided

12 — two opposite surfaces of the lead frame are formed with a mask layer thereon, so that these mask layers and the lead frame are formed together to be a multilayered structure 13 — a patterning process is performed on the multilayered structure, so that at least one through hole penetrating through the multilayered structure is formed on the multilayered structure 14 — a sandblasting process is performed in the through hole to form a rough textured surface in the through hole 15 — these mask layers are removed to expose the opposite surfaces of the lead frame 16 — a thermoforming process is performed to the lead frame so that a polymer material is encapsulated on the lead frame and filled into the through hole, and after curing, the polymer material is fixedly bonded on the rough textured surface 17 — a material removing procedure is performed for the cured polymer material 18 — an electroplating procedure is performed to the lead frame

Fig. 1

PACKAGE STRUCTURE AND METHOD OF MANUFACTURING THE SAME

RELATED APPLICATIONS

This application claims priority to Taiwan Application Serial Number 112115178, filed on Apr. 24, 2023, which is herein incorporated by reference in its entirety.

BACKGROUND

Field of Disclosure

The present disclosure relates to a package structure and a method of manufacturing the same.

Description of Related Art

Generally, in a process of manufacturing light-emitting diode devices, when a light-emitting die is placed on a lead frame, encapsulation material (e.g., epoxy resin) will be filled into an area of the lead frame where the light-emitting die is placed on, so that the cured encapsulation material can be firmly attached to the lead frame to effectively wrap the light-emitting die.

However, since the uncured encapsulation material may leak into slits formed on one side of the lead frame and quickly overflow to the other side of the lead frame, the encapsulation material cannot be stably attached to the lead frame, thereby reducing the reliability of packaging.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide a package structure and a method of manufacturing the same for solving the difficulties mentioned above in the prior art.

In one embodiment of the present disclosure, a method of manufacturing a package structure is provided, and the method of manufacturing the package structure includes several steps as follows. A lead frame is provided. A first mask layer is formed on an upper surface of the lead frame and a second mask layer is formed on a lower surface of the lead frame, so that the first mask layer, the lead frame and the second mask layer are formed together to be a multi-layered structure. A patterning process is performed on the multilayered structure, so that at least one through hole penetrating through the multilayered structure is formed. A sandblasting process is performed in the through hole to form a rough textured surface in the through hole. After sandblasting the multilayered structure, the first mask layer and the second mask layer are removed to expose the upper surface and the lower surface of the lead frame.

According to an embodiment of the present disclosure, in the method of manufacturing the package structure, the step of performing the sandblasting process further includes the multilayered structure is moved into an operation range of a dry sand blaster. A plurality of sand grains are ejected to the first mask layer and the through hole of the multilayered structure by the dry sand blaster to hit the first mask layer and an inner surface of the through hole so as to form the rough textured surface on the inner surface of the through hole. Dry air is blown out to the multilayered structure for taking away the sand grains from the first mask layer and the through hole of the multilayered structure.

According to an embodiment of the present disclosure, in the method of manufacturing the package structure, oscillation frequency of a nozzle head of the dry sand blaster is 5 Hz to 100 Hz, and a sandblasting pressure of the dry sand blaster is 0.005 MPa to 0.5 MPa.

According to an embodiment of the present disclosure, in the method of manufacturing the package structure, the sand grains contain one of aluminum oxide, silicon oxide, titanium oxide and stainless steel.

According to an embodiment of the present disclosure, the method of manufacturing the package structure further includes steps as follows. Coordinates of the through hole of the multilayered structure are detected before the sand grains are ejected into the through hole. A nozzle head of the dry sand blaster is controlled to align with the through hole of the multilayered structure in a straight line according to the coordinates of the through hole.

According to an embodiment of the present disclosure, in the method of manufacturing the package structure, roughness of the rough textured surface is 0.2 micron to 10 micron.

According to an embodiment of the present disclosure, in the method of manufacturing the package structure, the step of performing the patterning process further includes a step as follows. A local area of the multilayered structure is etched, so that the through hole is formed to penetrate through the first mask layer, the lead frame and the second mask layer.

According to an embodiment of the present disclosure, the method of manufacturing the package structure further includes steps as follows. After the step of removing the first mask layer and the second mask layer, a thermoforming process is performed to the lead frame so that a polymer material is encapsulated on the upper surface of the lead frame and filled into the through hole, and after the polymer material is cured, the polymer material is fixedly bonded on the rough textured surface in the through hole.

According to an embodiment of the present disclosure, the method of manufacturing the package structure further includes steps as follows. A pre-plating procedure is performed on the lead frame between the step of removing the first mask layer and the second mask layer and the step of the performing the thermoforming process.

In one embodiment of the present disclosure, a method of manufacturing a package structure is provided, and the method of manufacturing the package structure includes several steps as follows. A multilayered structure is provided, and the multilayered structure includes a first protection layer, a second protection layer, and a lead frame sandwiched between the first protection layer and the second protection layer. At least one through hole is formed on the multilayered structure. Coordinates of the through hole of the multilayered structure is detected. A plurality of particles are ejected into the through hole of the multilayered structure to hit an inner surface of the through hole so as to form a rough textured surface on the inner surface of the through hole. The first protection layer and the second protection layer are removed from the multilayered structure so that an upper surface and a lower surface of the lead frame are exposed outwardly. A thermoforming process is performed to the lead frame so that a polymer material is encapsulated on the upper surface of the lead frame and filled into the through hole, and after the polymer material is cured, the polymer material is fixedly bonded on the rough textured surface of the through hole.

According to an embodiment of the present disclosure, in the method of manufacturing the package structure, the step of the sandblasting process that is performed further includes steps as follows. The multilayered structure is moved into an operation range of a dry sand blaster. The particles are ejected by the dry sand blaster to the first protection layer and the through hole of the multilayered structure to hit the first protection layer and the inner surface of the through hole so as to form the rough textured surface on the inner surface of the through hole. Dry air is blown out to the multilayered structure for taking away the particles from the first mask layer and the through hole of the multilayered structure.

According to an embodiment of the present disclosure, in the method of manufacturing the package structure, oscillation frequency of a nozzle head of the dry sand blaster is 5 Hz to 100 Hz, and a sandblasting pressure of the dry sand blaster is 0.005 MPa to 0.5 MPa.

According to an embodiment of the present disclosure, in the method of manufacturing the package structure, the particles contain one of aluminum oxide, silicon oxide, titanium oxide and stainless steel.

According to an embodiment of the present disclosure, the method of manufacturing the package structure further includes a step as follows. A nozzle head of the dry sand blaster is controlled to align with the through hole of the multilayered structure in a straight line according to the coordinates of the through hole.

In one or more embodiments of the present disclosure, in the method of manufacturing the package structure, roughness of the rough textured surface is 0.2 micron to 10 micron.

In one or more embodiments of the present disclosure, in the method of manufacturing the package structure, the step of forming the through hole on the multilayered structure further includes a step as follows. A local area of the multilayered structure is etched, so that the through hole is formed together on the first mask layer, the lead frame and the second mask layer.

In one or more embodiments of the present disclosure, the method of manufacturing the package structure further includes a step as follows. A pre-plating procedure is performed on the lead frame between the step of removing the first protection layer and the second protection layer and the step of the performing the thermoforming process.

In one embodiment of the present disclosure, a package structure includes a lead frame, at least one through hole and an encapsulation body. The lead frame includes two opposite surfaces, and each of the opposite surfaces is a smooth surface. The through hole is penetrated through the lead frame, and connected to the opposite surfaces, and an inner surface of the through hole is formed with a rough textured surface. The encapsulation body is disposed on the lead frame, and fixedly bonded on the rough textured surface in the through hole.

Thus, through the construction of the embodiments above, the present disclosure is able to enhance the bonding strength between the encapsulation material and the lead frame, improve the leakage of the encapsulation material to the lead frame, improve the reliability of the encapsulation, and maintain the smoothness and brightness of the opposite surfaces of the lead frame.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 1 is a flow chart of a method of manufacturing a package structure according to one embodiment of the present disclosure.

DESCRIPTION OF THE EMBODIMENTS

Figures 2A, 2B:
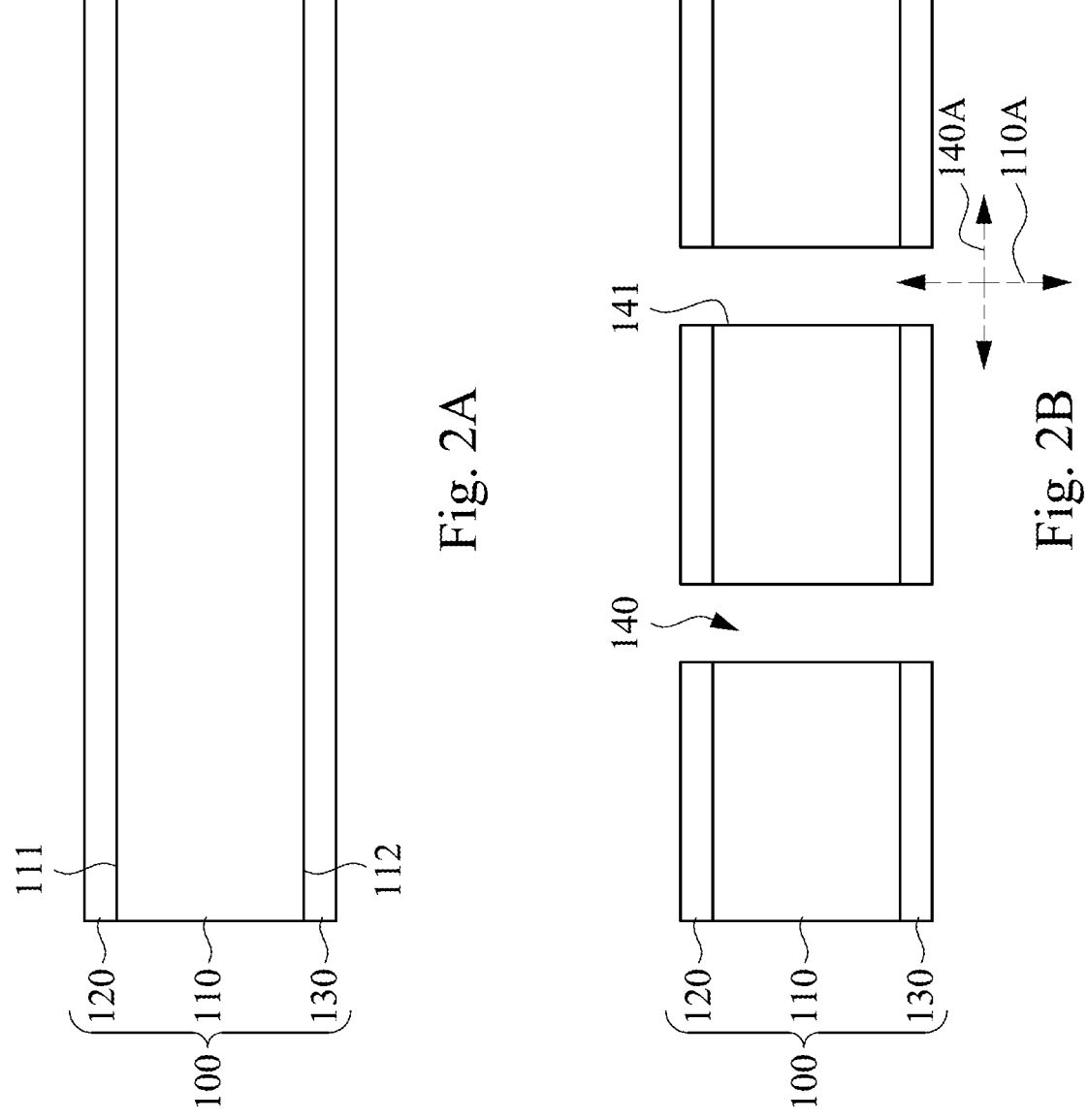
FIG. 2A to FIG. 2F are continual schematic diagrams of step 11 to step 16 of FIG. 1, respectively.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a flow chart of a method of manufacturing a package structure according to one embodiment of the present disclosure. As shown in FIG. 1, the method of manufacturing a package structure includes step 11 to step 18 as follows. In step 11, a lead frame is provided. In step 12, two opposite sides of the lead frame are formed with a mask layer thereon, respectively, so that these mask layers and the lead frame are formed together to be a multilayered structure. In step 13, a patterning process is performed on the multilayered structure, so that one or more through holes penetrating through the multilayered structure are formed on the multilayered structure. In step 14, a sandblasting process is performed in the through holes to form a rough textured surface in each of the through holes, respectively. In step 15, these mask layers are removed to expose the opposite surfaces of the lead frame. In step 16, a thermoforming process is performed to the lead frame so that a polymer material is encapsulated on the lead frame and filled into the through holes, and after the polymer material is cured, the polymer material is fixedly bonded on the rough textured surfaces in the through holes. In step 17, a material removing procedure is performed for one part of the cured polymer material. In step 18, an electroplating procedure (known as post-plating) is performed to the lead frame.

FIG. 2A to FIG. 2F are continual schematic diagrams of step 11 to step 16 of FIG. 1, respectively. As shown in FIG. 2A, in step 11, more specifically, the lead frame 110 includes an upper surface 111 and a lower surface 112 which are opposite to each other, and the upper surface 111 and the lower surface 112 are smooth surfaces, respectively. For example, the lead frame 110 is a metal substrate or a ceramic substrate.

As shown in FIG. 2A, in step 12, more specifically, a first mask layer 120 is formed to be attached on the upper surface 111 of the lead frame 110 and a second mask layer 130 is formed to be attached on the lead frame 110 so that the first mask layer 120, the lead frame 110 and the second mask layer 130 are formed together to be the aforementioned multilayered structure 100. For example, each of the first mask layer 120 and the second mask layer 130 is a protection layer such as a dry film or a photoresist, respectively.

As shown in FIG. 2B, in step 13, more specifically, the first mask layer 120 of the multilayered structure 100 is treated to be exposed and developed, and a local area of the multilayered structure 100 is etched according to an etching pattern, and after an etching reaction, the aforementioned etching pattern is formed thereon. The etching pattern includes the through holes 140 mentioned above, and each of the through holes 140 collectively penetrate the first mask layer 120, the lead frame 110 and the second mask layer 130, and each of the through holes 140 is connected to the upper surface 111 and the lower surface of the lead frame 110, respectively. An axial direction 140A of each of the through holes 140 is perpendicular to the long axial direction 110A of the lead frame 110.

Figures 2C, 2D:
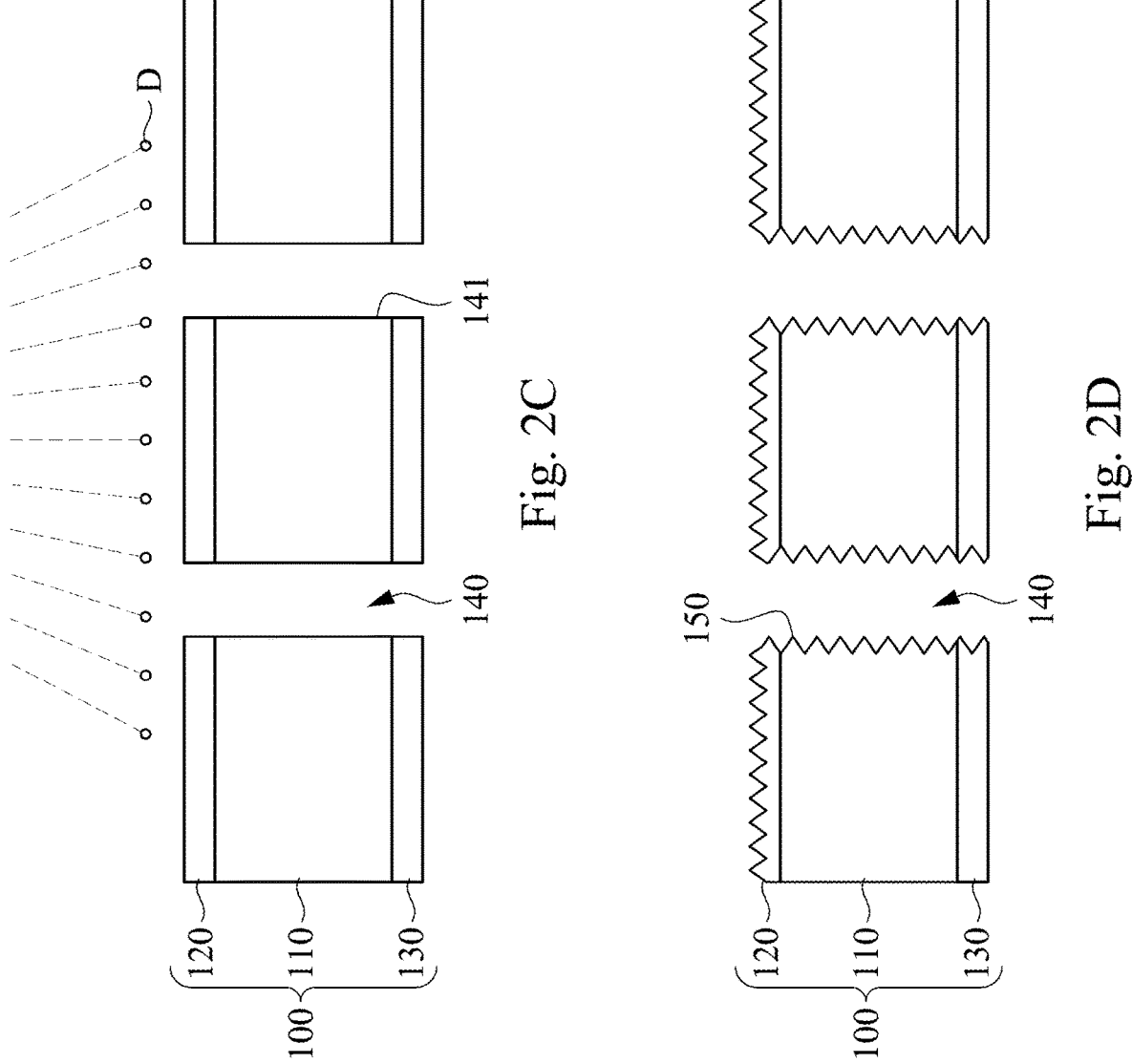

As shown in FIG. 2C and FIG. 2D, in step 14, more specifically, a dry sandblasting process is performed on the first mask layer 120 and the through holes 140 of the multilayered structure 100, so that a surface of the first mask layer 120 and the inner surfaces 141 of the through holes 140 form a rough textured surface 150 thereon, respectively. For example, the roughness of the rough textured surface 150 is 0.2 to 10 μm, 0.2 to 1 μm or 1.5 to 10 μm, however, the present disclosure is not limited thereto.

Figures 2E, 2F:
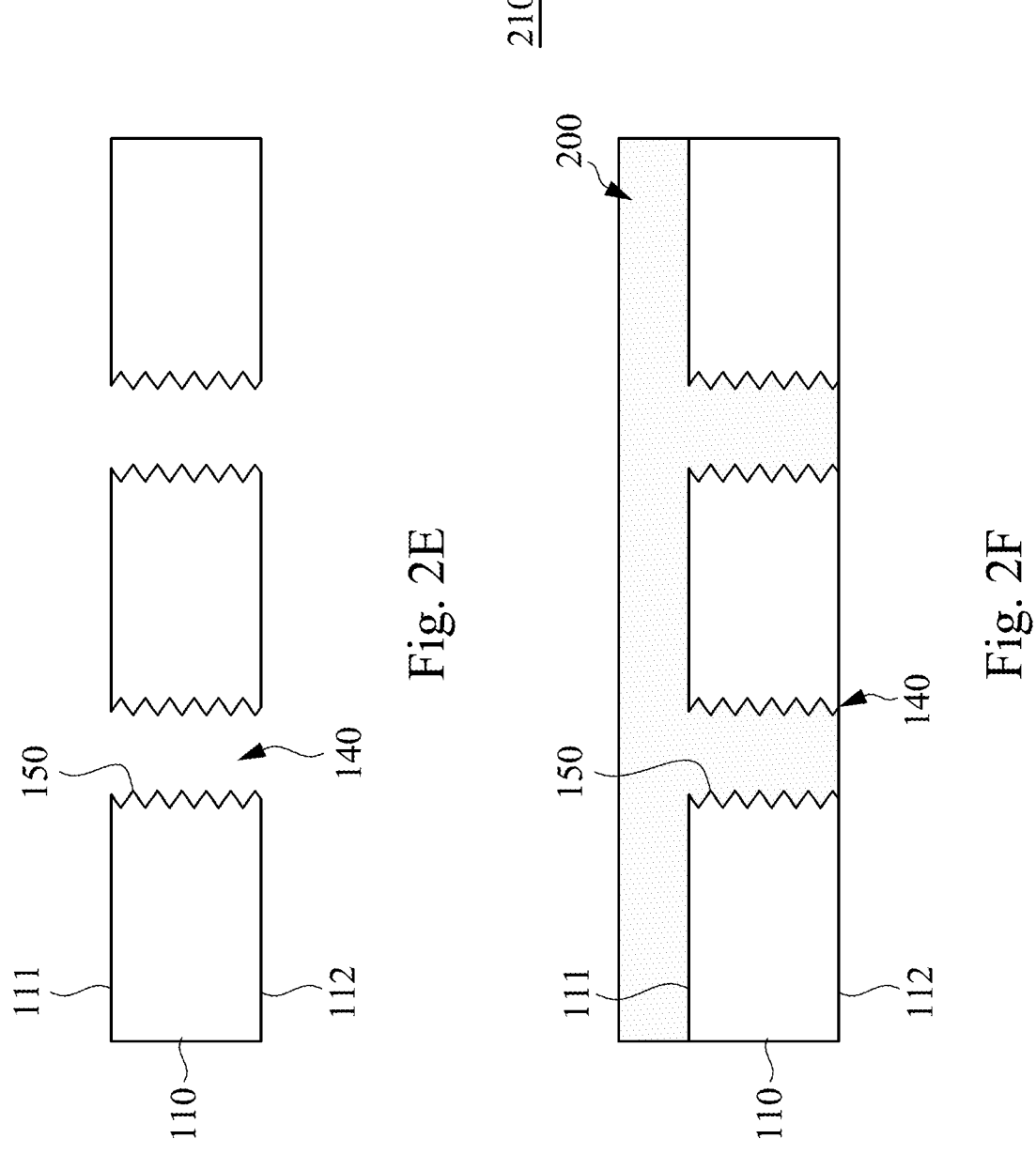

As shown in FIG. 2E, in step 15, more specifically, the first mask layer 120 and the second mask layer 130 are removed from the multilayered structure 100 so as to expose the upper surface 111 and the lower surface 112 of the lead frame 110. The way for removing the first mask layer 120 and the second mask layer 130 is not limited to physical or chemical approach. Since the way for removing the first mask layer 120 and the second mask layer 130 is well known, further descriptions are omitted herein.

As shown in FIG. 2F, in step 16, the thermoforming process is performed to the lead frame 110 so that the polymer material is encapsulated on the upper surface 111 of the lead frame 110 and filled into the through holes 140, and after the polymer material is cured, the polymer material is fixedly bonded on the rough textured surfaces in the through holes, and a curing process is performed to the polymer material so that the polymer material wrapping the lead frame 110 can be changed into an encapsulation body 200. One part of the encapsulation body 200 covers the upper surface 111 of the lead frame 110, and the remaining part is respectively fixedly bonded to the rough textured surface 150 in each of the through holes 140 to preliminarily form a package structure 210. The package structure 210 is, for example, a light emitting diode packaging structure, and the polymer material is, for example, epoxy resin or silicone.

However, the present disclosure is not limited thereto. In other embodiments, it is also possible to introduce another step of performing a pre-plating procedure on the lead frame 110 between step 15 and step 16. A metal plating layer deposited on the lead frame 110 is used to improve the bonding force between the metal plating layer and the lead frame 110, and this step is not limited to pre-plating a single layer or multiple layers on the lead frame 110. In addition, the post-plating procedure to the lead frame 110 in step 18 is not limited to forming one or more plating layers on the lead frame 110; otherwise, step 18 may also be omitted in other embodiments.

Figure 3A:
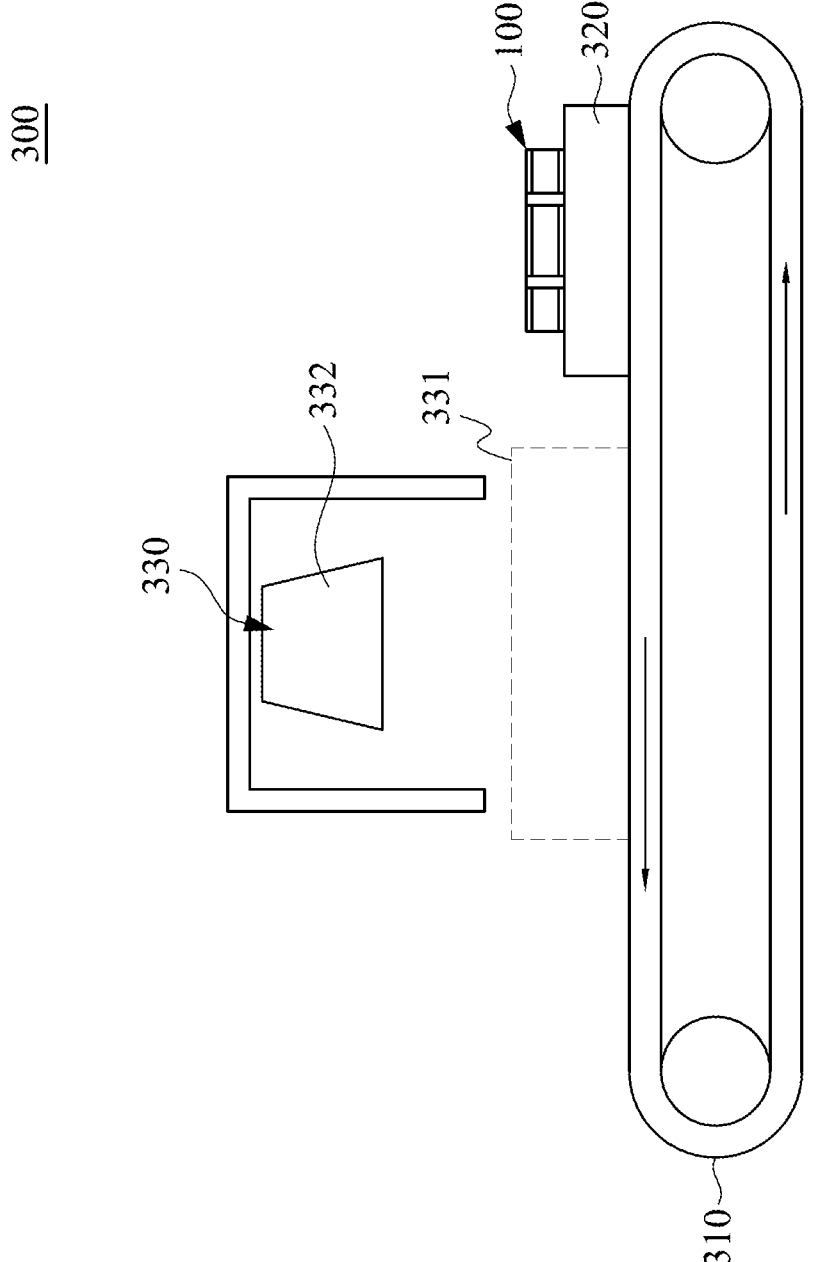
FIG. 3A to FIG. 3C are continual schematic diagrams of step 14 of FIG. 1 according to one embodiment.
Figure 3B:
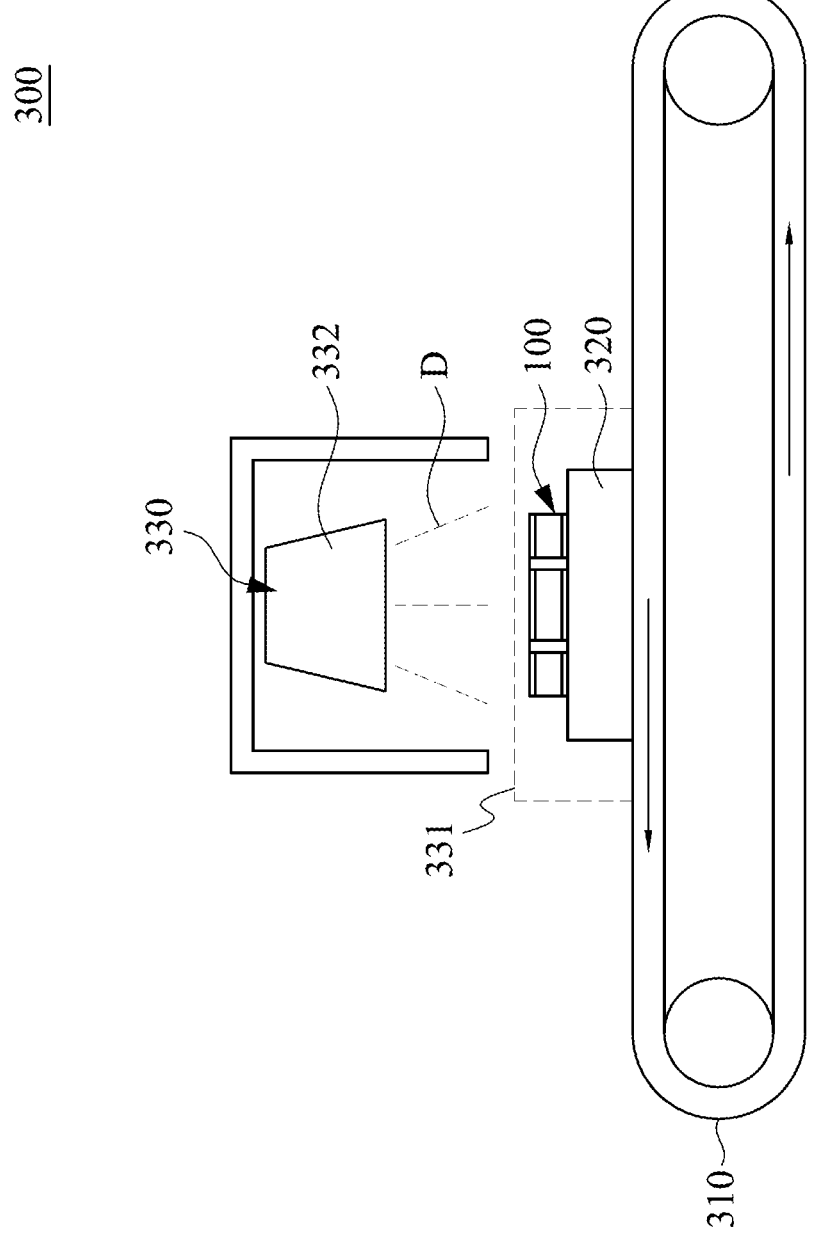
Figure 3C:
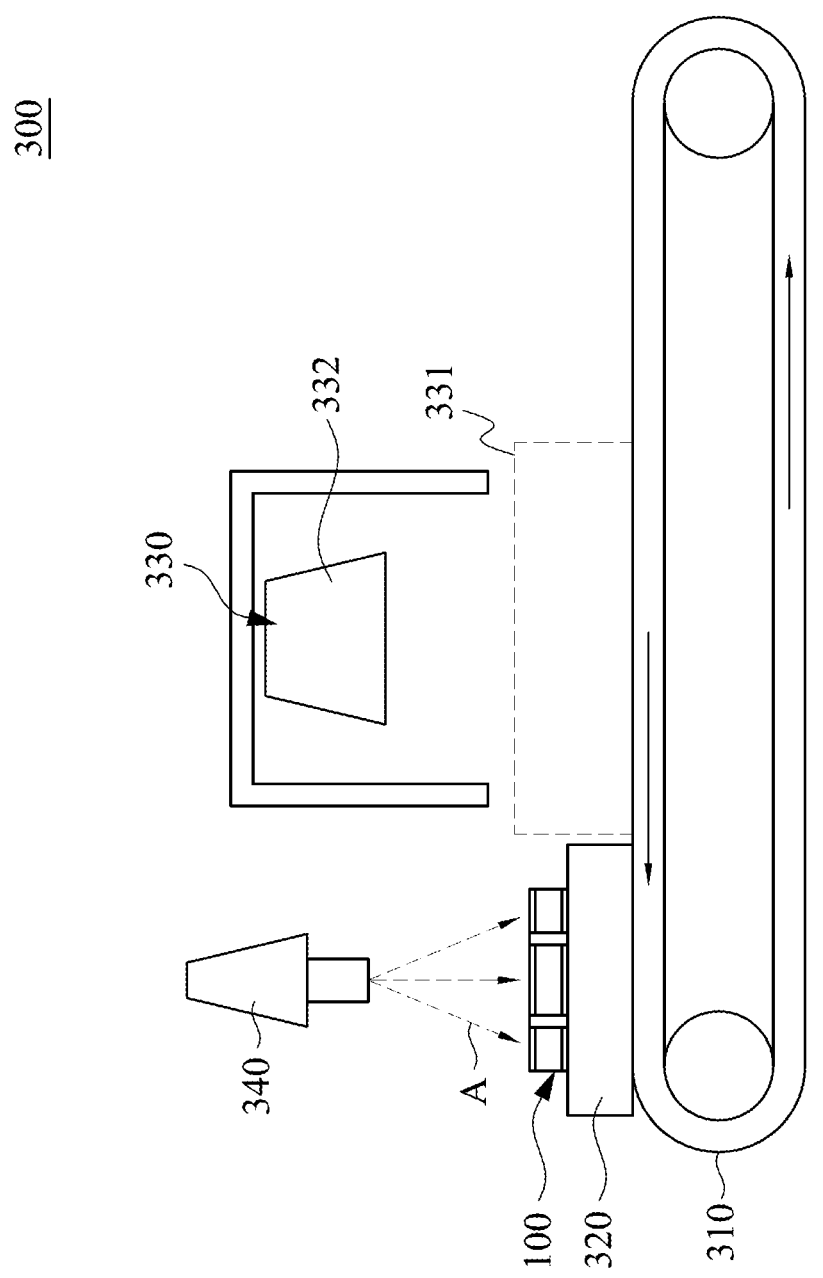

FIG. 3A to FIG. 3C are continual schematic diagrams of step 14 of FIG. 1 according to one embodiment. As shown in FIG. 3A and FIG. 3B, in this embodiment, a roughening apparatus 300 includes a conveyor belt device 310, a loading tray 320 and a dry sand blaster 330. The loading tray 320 is used to load the above-mentioned multilayered structure 100, wherein the multilayered structure 100 is placed on the loading tray 320 through the second mask layer 130. The conveyor belt device 310 is used to carry the loading tray 320 to move horizontally, for example, to carry the multilayered structure 100 into an operation range 331 of a dry sand blaster 330. The dry sand blaster 330 is located above the conveyor belt device 310, and a nozzle head 332 of the dry sand blaster 330 is used to erupt a large amount of high-pressure particles (e.g., abrasive material or sand grains D) toward the first mask layer 120 of the multilayered structure 100. As shown in FIG. 3C, the roughening apparatus 300 further includes a compressed air nozzle 340. The compressed air nozzle 340 is disposed outside the operation range 331 of the dry sand blaster 330, and is used to blow out high-pressure dry air A to the loading tray 320.

Thus, in this embodiment, in step 14, the step of sandblasting the through holes 140 includes several steps as follows. First, as shown in FIG. 3A and FIG. 3B, the multilayered structure 100 is moved into the operation range 331 of the dry sand blaster 330. More specifically, the conveyor belt device 310 moves the loading tray 320 and the multilayered structure 100 thereon into the operation range 331 of the dry sand blaster 330.

Next, as shown in FIG. 3B, particles (e.g., abrasive material or sand grains D) are ejected by the nozzle head 332 to hit the surface of the first mask layer 120 and the inner surface 141 of each of the through holes 140 so that a rough textured surface 150 is formed on the inner surface 141 of each of the through holes 140 (refer to FIG. 2D). More specifically, the nozzle head 332 of the dry sand blaster 330 is swung repeatedly, so that the particles (e.g., abrasive material or sand grains D) can be repeatedly hit the first mask layer 120 of the multilayered structure 100 and the inner surface 141 of all of the through holes 140 (refer to FIG. 2C), so that the inner surface 141 of each of the through holes 140 is formed with the aforementioned rough textured surfaces 150.

Next, as shown in FIG. 3C, dry air A is blown out to the first mask layer 120 and the through holes 140 of the multilayered structure 100 for taking away the foreign matter (e.g., abrasive material or sand grains D) from the first mask layer 120 and the through holes of the multilayered structure 100.

In addition, after the dry sandblasting process, the multilayered structure 100 can be selectively cleaned, for example, using deionized water (DI water) or other suitable cleaning solutions to remove the particles (e.g., abrasive material or sand grains) or other substances on the multilayered structure 100.

More specifically, in one embodiment, oscillation frequency of the nozzle head 332 of the dry sand blaster 330 is 5 Hz to 100 Hz, and a sandblasting pressure of the dry sand blaster 330 is 0.005 MPa to 0.5 MPa, and the conveyor belt speed of conveyor belt device 310 is 5 cm/min to 120 cm/min. However, the present disclosure is not limited thereto.

In one embodiment, the shape of the particles (e.g., abrasive material or sand grains) is granular, beaded, spherical or irregular, however, the present disclosure is not limited thereto. In one embodiment, the material of the particles (e.g., abrasive material or sand grains) may include aluminum oxide, silicon oxide, titanium oxide or stainless steel. In one embodiment, the material of the particles (e.g., abrasive material or sand grains) include brown alumina #180, brown alumina #280, glass sand #120, rounded steel #120 or/and black alumina #180, however, the present disclosure is not limited thereto. The size of the brown alumina #280 is 40 to 70 μm, the size of the brown alumina #180 is 63 to 75 μm, the size of the black alumina #180 is 63 to 75 μm, the size of the glass sand #120 has a grain size of 105 to 150 μm, and the rounded steel #120 has a size of 1000 to 1410 μm.

Figure 4:
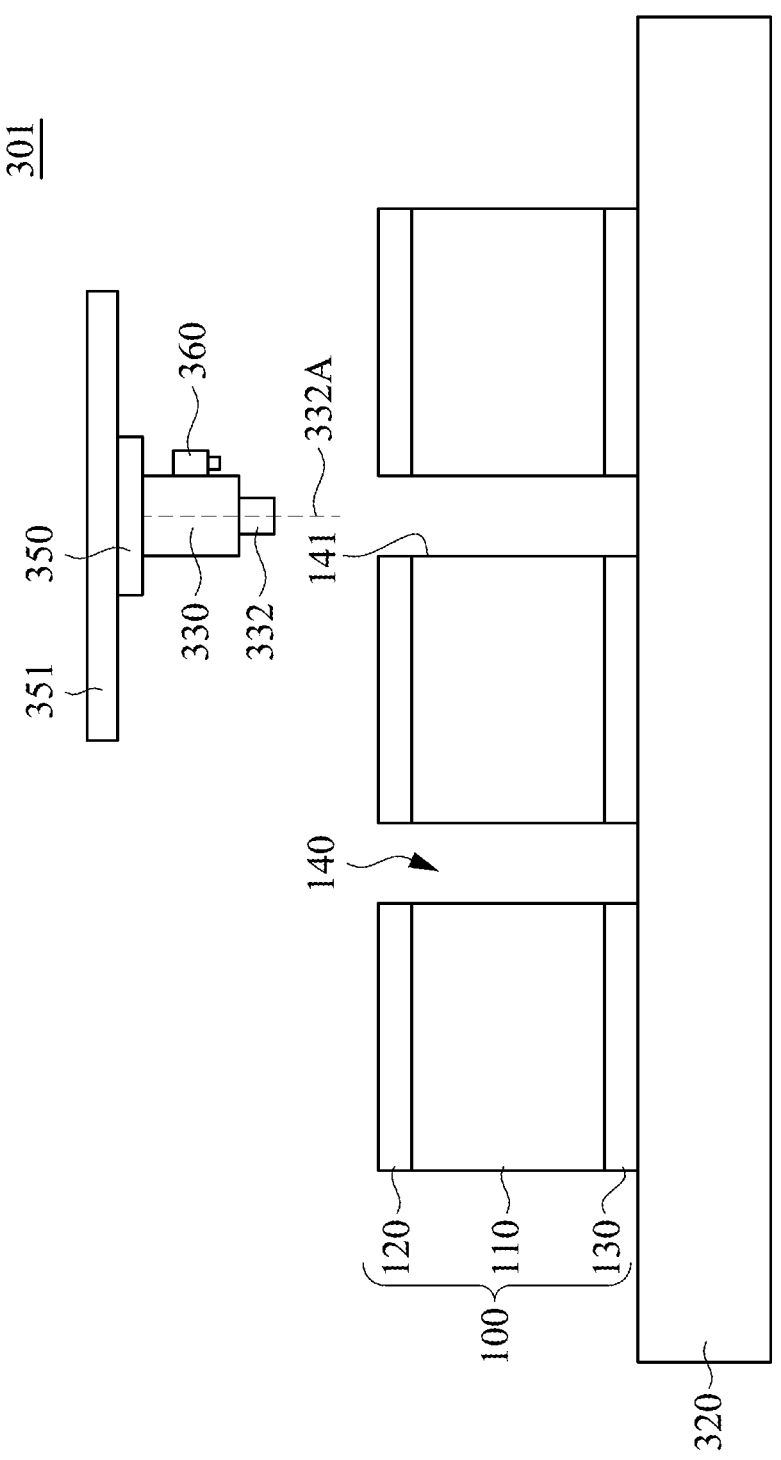
FIG. 4 is a schematic diagram of step 14 of FIG. 1 according to one embodiment.

FIG. 4 is a schematic diagram of step 14 of FIG. 1 according to one embodiment. As shown in FIG. 4, the roughening apparatus 301 of this embodiment is substantially the same as above, except that the nozzle head 332 of the conveyor belt device 310 is movable. More specifically, the roughening apparatus 301 further includes a conveying device 350 and a position detecting device 360. The nozzle head 332 of the conveyor belt device 310 is fixed on the conveying device 350, and the position detecting device 360 is fixed on the conveyor belt device 310. The position detection device 360 is, for example, a combination of a camera device and a processing circuit thereof.

In the embodiment, before the particles (e.g., abrasive material or sand grains D) ejected into the through hole 140, several steps are provided as follows. Coordinates of each of the through holes of the multilayered structure 100 are detected, more specifically; the position detecting device 360 detects coordinates of each of the through holes 140 of the multilayered structure 100. Next, the nozzle head 332 of the dry sand blaster 330 is controlled to sequentially align with each of the through holes 140 of the multilayered structure 100 in a straight line according to the coordinates of each of the through holes 140. More precisely, the roughening apparatus 301 instructs the conveying device 350 to move the nozzle head 332 to the top of each of the through holes 140 of the multilayered structure 100 along a track 351 in sequence according to the coordinates of each of the through holes 140, so that the nozzle head 332 can eject particles (e.g., abrasive material or sand grains D) to the inner surfaces 141 of each of the through holes 140. In one embodiment, the long axial direction 332A of the nozzle head 332 is coaxial with the axial direction 140A of the through hole 140, or the long axial direction 332A and the axial direction 140A form an included angle between 5 degrees and 45 degrees.

Thus, through the construction of the embodiments above, the present disclosure is able to enhance the bonding strength between the encapsulation material and the lead frame, improve the leakage of the encapsulation material to the lead frame, improve the reliability of the encapsulation, and maintain the smoothness and brightness of the opposite surfaces of the lead frame.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A method of manufacturing a package structure, comprising:
   providing a lead frame;
   forming a first mask layer on an upper surface of the lead frame and a second mask layer on a lower surface of the lead frame, so that the first mask layer, the lead frame and the second mask layer are formed together to be a multilayered structure;
   performing a patterning process on the multilayered structure, so that at least one through hole penetrating through the multilayered structure is formed;
   performing a sandblasting process in the at least one through hole to form a rough textured surface on an inner surface of the at least one through hole; and
   after the sandblasting process, removing the first mask layer and the second mask layer to expose the upper surface and the lower surface of the lead frame.

2. The method of manufacturing the package structure of claim 1, wherein the step of performing the sandblasting process further comprises:
   moving the multilayered structure into an operation range of a dry sand blaster;
   ejecting a plurality of sand grains by the dry sand blaster to the first mask layer and the at least one through hole of the multilayered structure to hit the first mask layer and an inner surface of the at least one through hole so as to form the rough textured surface on the inner surface of the at least one through hole; and
   blowing out dry air to the multilayered structure for taking away the sand grains from the first mask layer and the at least one through hole of the multilayered structure.

3. The method of manufacturing the package structure of claim 2, wherein oscillation frequency of a nozzle head of the dry sand blaster is 5 Hz to 100 Hz, and a sandblasting pressure of the dry sand blaster is 0.005 MPa to 0.5 MPa.

4. The method of manufacturing the package structure of claim 2, wherein the sand grains contain one of aluminum oxide, silicon oxide, titanium oxide and stainless steel.

5. The method of manufacturing the package structure of claim 2, further comprising:
   before the step of ejecting the sand grains into the at least one through hole, detecting coordinates of the at least one through hole of the multilayered structure; and
   according to the coordinates of the at least one through hole, controlling a nozzle head of the dry sand blaster to align with the at least one through hole of the multilayered structure in a straight line.

6. The method of manufacturing the package structure of claim 1, wherein roughness of the rough textured surface is 0.2 micron to 10 micron.

7. The method of manufacturing the package structure of claim 1, wherein the step of performing the patterning process further comprises:
   etching a local area of the multilayered structure, so that the at least one through hole is formed to penetrate through the first mask layer, the lead frame and the second mask layer.

8. The method of manufacturing the package structure of claim 1, further comprising:
   after the step of removing the first mask layer and the second mask layer, performing a thermoforming process to the lead frame so that a polymer material is encapsulated on the upper surface of the lead frame and filled into the at least one through hole, and after the polymer material is cured, the polymer material is fixedly bonded on the rough textured surface in the at least one through hole.

9. The method of manufacturing the package structure of claim 8, further comprising:

performing a pre-plating procedure on the lead frame between the step of removing the first mask layer and the second mask layer and the step of the performing the thermoforming process.

10. A method of manufacturing a package structure, comprising:

providing a multilayered structure having a first protection layer, a second protection layer and a lead frame that is sandwiched between the first protection layer and the second protection layer;

forming at least one through hole on the multilayered structure;

detecting coordinates of the at least one through hole of the multilayered structure;

ejecting a plurality of particles into the at least one through hole of the multilayered structure to hit an inner surface of the at least one through hole so as to form a rough textured surface on the inner surface of the at least one through hole;

removing the first protection layer and the second protection layer from the multilayered structure so that an upper surface and a lower surface of the lead frame are exposed outwardly; and performing a thermoforming process to the lead frame so that a polymer material is encapsulated on the upper surface of the lead frame and filled into the at least one through hole, and after the polymer material is cured, the polymer material is fixedly bonded on the rough textured surface of the at least one through hole.

11. The method of manufacturing the package structure of claim 10, wherein the step of ejecting the particles into the at least one through hole of the multilayered structure further comprises:

moving the multilayered structure into an operation range of a dry sand blaster;

ejecting the particles by the dry sand blaster to the first protection layer and the at least one through hole of the multilayered structure to hit the first protection layer and the inner surface of the at least one through hole so as to form the rough textured surface on the inner surface of the at least one through hole; and blowing out dry air to the multilayered structure for taking away the particles from the first protection layer and the at least one through hole of the multilayered structure.

12. The method of manufacturing the package structure of claim 11, wherein oscillation frequency of a nozzle head of the dry sand blaster is 5 Hz to 100 Hz, and a sandblasting pressure of the dry sand blaster is 0.005 MPa to 0.5 MPa.

13. The method of manufacturing the package structure of claim 11, wherein the particles contain one of aluminum oxide, silicon oxide, titanium oxide and stainless steel.

14. The method of manufacturing the package structure of claim 11, wherein the step of ejecting the particles to the at least one through hole of the multilayered structure further comprises:

controlling a nozzle head of the dry sand blaster to align with the at least one through hole of the multilayered structure in a straight line.

15. The method of manufacturing the package structure of claim 11, wherein roughness of the rough textured surface is 0.2 micron to 10 micron.

16. The method of manufacturing the package structure of claim 10, wherein the step of forming the at least one through hole on the multilayered structure further comprises:

etching a local area of the multilayered structure, so that the at least one through hole is formed together on the first protection layer, the lead frame and the second protection layer.

17. The method of manufacturing the package structure of claim 10, further comprising:

performing a pre-plating procedure on the lead frame between the step of removing the first protection layer and the second protection layer and the step of the performing the thermoforming process.

* * * * *